United States Patent
Nakagawa et al.

(10) Patent No.: US 7,167,344 B2
(45) Date of Patent: Jan. 23, 2007

(54) MAGNETIC HEAD ACTUATOR HAVING FINELY MOVABLE TRACKING DEVICE

(75) Inventors: Masayoshi Nakagawa, Niigata-ken (JP); Tohru Nakazawa, Niigata-ken (JP); Hideki Abe, Niigata-ken (JP); Koji Nagao, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 257 days.

(21) Appl. No.: 10/043,739

(22) Filed: Jan. 9, 2002

(65) Prior Publication Data

US 2002/0089793 A1 Jul. 11, 2002

(30) Foreign Application Priority Data

Jan. 11, 2001  (JP) .......... 2001-003882

(51) Int. Cl.
*G11B 21/24* (2006.01)
*G11B 5/56* (2006.01)
*G11B 21/10* (2006.01)

(52) U.S. Cl. ................... 360/294.4; 360/294.6

(58) Field of Classification Search .......... 360/294.4, 360/244.9, 245.8, 245.9, 294.6
See application file for complete search history.

(56) References Cited

U.S. PATENT DOCUMENTS

| | | | | |
|---|---|---|---|---|
| 5,764,444 A | * | 6/1998 | Imamura et al. | 360/294.4 |
| 5,815,347 A | * | 9/1998 | Pattanaik | 360/234.5 |
| 5,870,258 A | | 2/1999 | Khan et al. | 360/245.9 |
| 5,898,544 A | | 4/1999 | Krinke et al. | 360/264.5 |
| 5,929,326 A | * | 7/1999 | Imaino et al. | 73/105 |
| 6,019,271 A | * | 2/2000 | Hayden et al. | 228/110.1 |
| 6,163,434 A | * | 12/2000 | Zhang | 360/294.5 |
| 6,233,124 B1 | * | 5/2001 | Budde et al. | 360/294.4 |
| 6,239,953 B1 | * | 5/2001 | Mei | 360/294.4 |
| 6,421,211 B1 | * | 7/2002 | Hawwa et al. | 360/294.4 |
| 6,597,541 B1 | * | 7/2003 | Nishida et al. | 360/294.4 |
| 6,614,627 B1 | * | 9/2003 | Shimizu et al. | 360/294.4 |
| 2001/0004303 A1 | * | 6/2001 | Wada et al. | 360/75 |

FOREIGN PATENT DOCUMENTS

| | | |
|---|---|---|
| JP | 58-138043 | 8/1983 |
| JP | 6-52145 | 7/1994 |
| JP | 7-285219 | 10/1995 |
| JP | 8-45994 | 2/1996 |
| JP | 9-223721 | 8/1997 |
| JP | 11-67806 | 3/1999 |
| JP | 11-330125 | 11/1999 |
| JP | 2000-182341 | 6/2000 |
| JP | 2000-223513 | 8/2000 |
| JP | 2000-286304 | 10/2000 |
| JP | 2000-348451 | 12/2000 |
| JP | 2000-357377 | 12/2000 |
| WO | WO 99/06993 | 2/1999 |

OTHER PUBLICATIONS

Japanese Office Action dated Jul. 14, 2004 for Japanese Patent Application No. 2001-003882.

* cited by examiner

*Primary Examiner*—Angel Castro
*Assistant Examiner*—Christopher R Magee
(74) *Attorney, Agent, or Firm*—Brinks Hofer Gilson & Lione

(57) ABSTRACT

A magnetic head actuator provided with a finely movable tracking device having a piezoelectric element is provided for easy wiring to the piezoelectric element and reducing problems such as wire breakage and continuity defects. In the magnetic head actuator, a portion of an FPC board resin base is removed to expose a portion of the feeding line that extends onto a voltage impressing electrode. An electrical and mechanical connection is made between the electrode and the exposed portion of the feeding line by ultrasonic bonding, Au ball bonding, or stud bumping.

20 Claims, 10 Drawing Sheets ered by conventional gold (Au)

MAGNETIC HEAD ACTUATOR HAVING FINELY MOVABLE TRACKING DEVICE

BACKGROUND OF THE INVENTION

1. Field of the Invention

The present invention relates to a magnetic head actuator having a finely movable tracking device and, more particularly, to a power feeding structure for wiring to a piezoelectric element of the tracking device.

2. Description of the Related Art

A magnetic head actuator widely used in an HDD is provided with a magnetic head opposing a rotating hard disk. The magnetic head is positioned at the free end of a swing arm, which swings reciprocally around the rotation axis of the base of the swing arm. In accordance with tracking signals from the hard disk, the actuator allows the swing arm to swing around the rotation axis. In order to meet the demand for a narrower track width or a smaller track pitch, a finely movable tracking device is constructed, such that a piezoelectric element, which expands and contracts when a voltage is applied, is mounted in the swing arm. Thus, the free end of the swing arm makes a fine arcuate movement around the rotation axis of the arm in accordance with expansion and contraction of the piezoelectric element.

In a conventional magnetic head actuator provided with the finely movable tracking device, a ground electrode of the piezoelectric element is electrically connected to the swing arm, and power is supplied to a voltage-impressing electrode via a feeding line of a flexible printed circuit (FPC) board that extends along the swing arm. The feeding line of the FPC board and the voltage-impressing electrode of the piezoelectric element are bonded by conventional gold (Au) wire bonding.

The Au wire bonding, however, is not only expensive due to the many man-hours required but also the Au wire bond is easily broken by an external force applied to the thin Au wire, which has a diameter on the order of a few micrometers. Also, a component, such as a magnetic head actuator that is incorporated into an HDD in an additional step after assembly the wiring is easily broken, thereby leading to continuity defects and low yield.

SUMMARY OF THE INVENTION

The present invention provides a magnetic head actuator with a finely movable tracking device that which facilitates wiring to a piezoelectric element, while reducing problems such as wire breakage and continuity defects in the wiring.

The present invention facilitates connecting a voltage-impressing electrode of a piezoelectric element and a feeding line of an FPC board without using Au wire bonding. To this end, the feeding line of the FPC board is arranged to extend onto the voltage-impressing electrode, where an exposed portion is formed by removing a resin base of the FPC board that extends onto the electrode. Also, an electrical and mechanical connection to the electrode at the exposed portion is made by ultrasonic bonding, Au ball bonding or stud bumping.

A magnetic head actuator having a finely movable tracking device according to the present invention comprises a swing arm having a magnetic head at the free end of the swing arm, the swing arm being reciprocally movable around a coarse rotation axis of the base of the swing arm; a piezoelectric element, mounted in the swing arm, for allowing a fine arcuate movement of the free end around the coarse rotation axis when a voltage is applied; and an FPC board having a resin base and a feeding line embedded in the resin base for feeding power to a voltage-impressing electrode. The feeding line of the FPC board is arranged to extend onto the voltage-impressing electrode of the piezoelectric element. The feeding line has an exposed portion formed by removing the resin base from a portion of the feeding line extending onto the electrode and a direct electrical connection is made to the electrode at the exposed portion.

In another aspect of the present invention, in the magnetic head actuator, the feeding line of the FPC board is arranged to extend onto the voltage-impressing electrode of the piezoelectric element. The feeding line lies in the FPC board other than the portion to be bonded to the piezoelectric element. A direct electrical connection is made to the electrode at the exposed portion of the feeding line.

Specifically, as used herein, electrical conduction means any mechanical and electrical bonding, and may include ultrasonic bonding, Au ball bonding, and the like.

Preferably, the feeding line arranged to extend onto the voltage-impressing electrode of the piezoelectric element is partially exposed at the upper and lower portions of the feeding line. After a through-hole is formed at the exposed portion, a gold ball is inserted into the through-hole and the feeding line is electrically bonded to the electrode by gold ball bonding. Alternatively, after forming a stud bump made of conductive material on the piezoelectric element, the feeding line is electrically connected to the electrode by inserting the stud bump into the through-hole of the feeding line.

Although a swing arm can provide a single piezoelectric element in a preferred embodiment of the invention, the swing arm is provided with a pair of piezoelectric elements having polarities opposite to each other so that the magnetic head makes a larger movement.

Although an FPC board having a feeding line leading to the piezoelectric element can be prepared separately, in a preferred embodiment the FPC board includes a trace line leading to the magnetic head and extending in the FPC board.

Thus, the present invention provides a magnetic head actuator, provided with a finely movable tracking device using a piezoelectric element that facilitates wiring to the piezoelectric element while reducing problems such as wire breakage and continuity defects.

DESCRIPTION OF THE PREFERRED EMBODIMENTS

Figure 1:
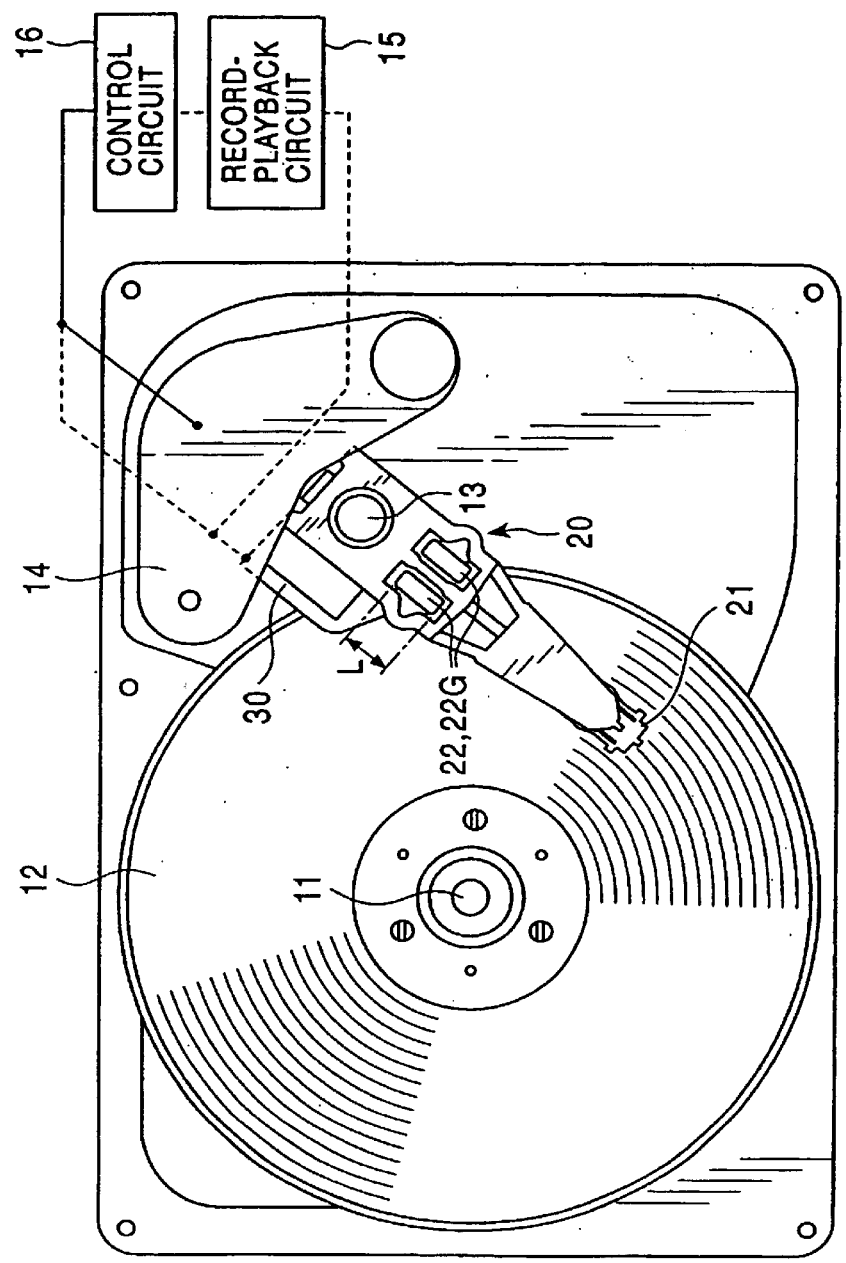
FIG. 1 is a plan view of an HDD provided with a magnetic head actuator according to the present invention.

FIG. 1 shows an overall structure of an HDD provided with a magnetic head actuator according to embodiments of the present invention. Away from a hard disk (magnetic disk) 12 rotating along a rotation axis 11, the base of a swing arm 20 comprising a load beam and a gimbal spring is supported in a reciprocally swinging manner around a coarse rotation axis 13. A magnetic head (flexure) 21 is supported at the free end of the swing arm 20. The magnetic head 21 moves reciprocally in the substantially radial direction of the hard disk 12 when the swing arm 20 is swung reciprocally around the coarse rotation axis 13 by an actuator 14.

Figure 3:
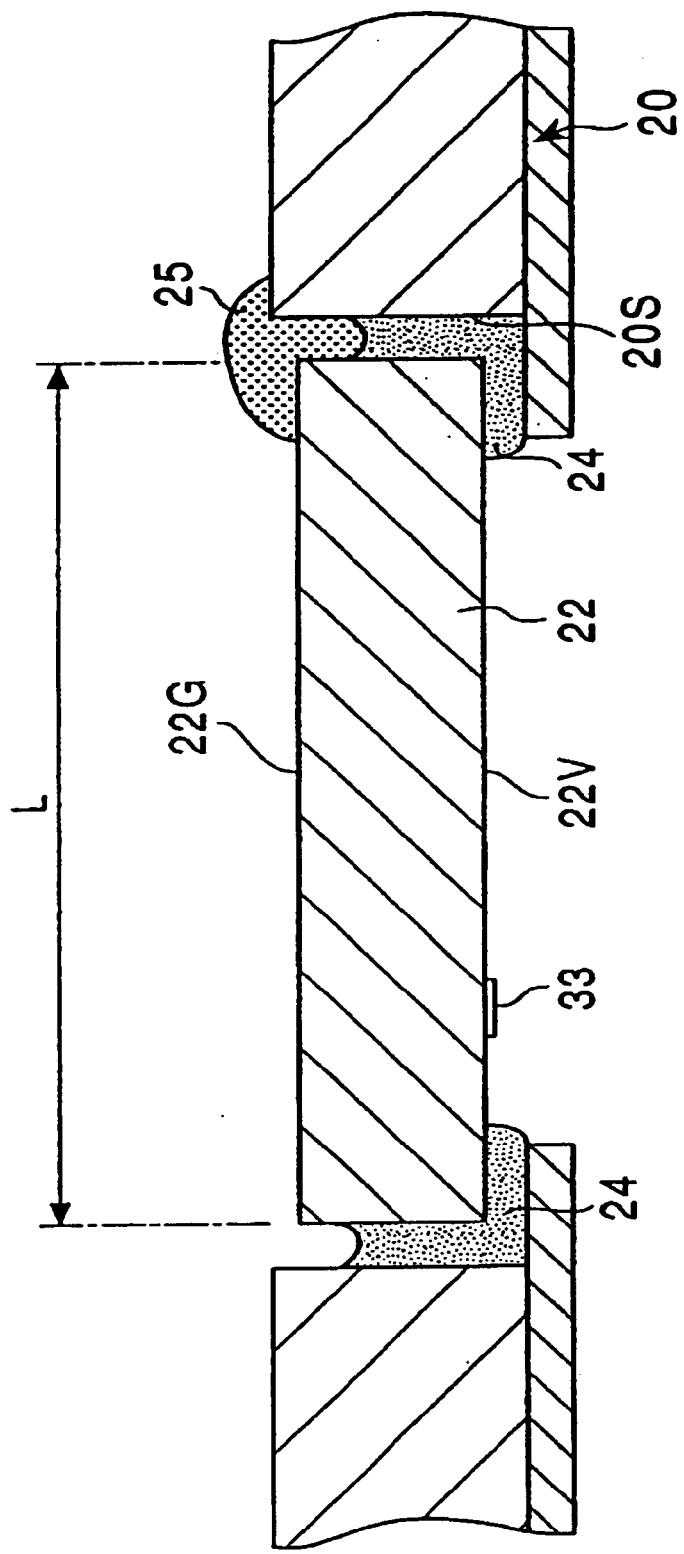
FIG. 3 is a cross-sectional view taken along the lines III—III shown in FIG. 2.

A pair of piezoelectric elements 22 having polarities opposite to each other are mounted in parallel in the swing arm 20 on both sides of an imaginary line drawn between the coarse rotation axis 13 and the magnetic head 21. As shown in FIGS. 1 and 3, the piezoelectric elements 22 each have a ground electrode 22G on one of the front and back surfaces thereof and a voltage-impressing electrode 22V on the other surface. The piezoelectric elements 22 are polarized, such that long sides L of the piezoelectric elements 22 are parallel to the imaginary line, and one of the long sides L expands while the other contracts when the same voltage is placed across the ground electrode 22G and the voltage-impressing electrode 22V of each piezoelectric element 22.

In order to transmit expansion and contraction in the direction of the long side L of the pair of piezoelectric elements 22 to the swing arm 20, the swing arm 20 has a pair of spaces 20S therein for accommodating the piezoelectric elements 22. Each piezoelectric element 22 has clearances on both ends in the direction of the long side L as shown in FIG. 3. The clearances are filled with an insulating non-shrinkable resin 24. The pair of piezoelectric elements 22 mounted in the swing arm 20, as described above, allow a fine arcuate movement of the magnetic head 21 of the swing arm 20 around the coarse rotation axis 13 when one of the piezoelectric elements 22 expands, while the other contracts. When one of the piezoelectric elements 22 expands while the other contracts by, for example, about 1 μm, the current technology level permits the magnetic head 21 to make a fine movement of about 10 μm in the arcuate direction around the coarse rotation axis 13. In this embodiment, the swing arm 20 is grounded through electrical connection with the ground electrodes 22G via an electrically conductive resin 25 made of metal or conductive material as shown in FIG. 3.

Figure 2:
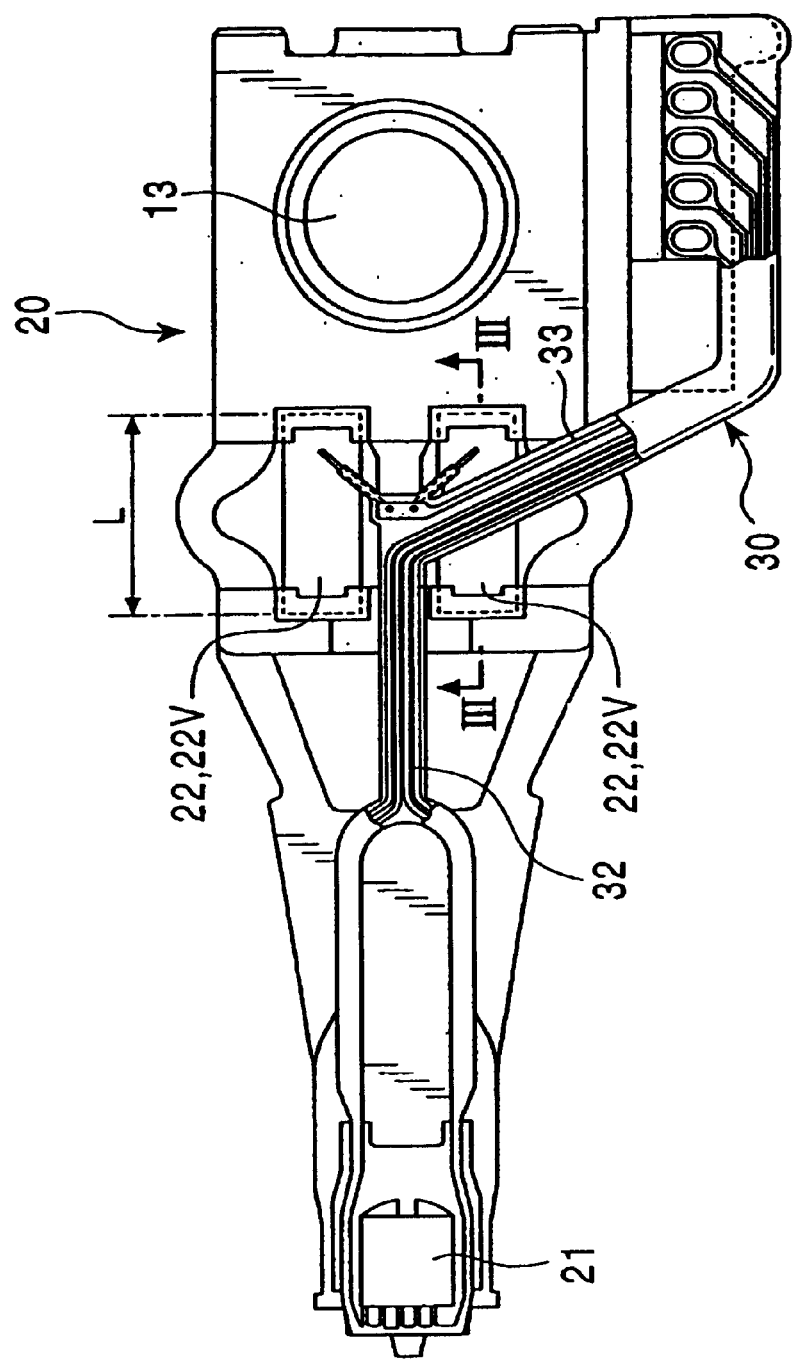
FIG. 2 is a rear view of the sole magnetic head actuator (swing arm) shown in FIG. 1.
Figure 4:
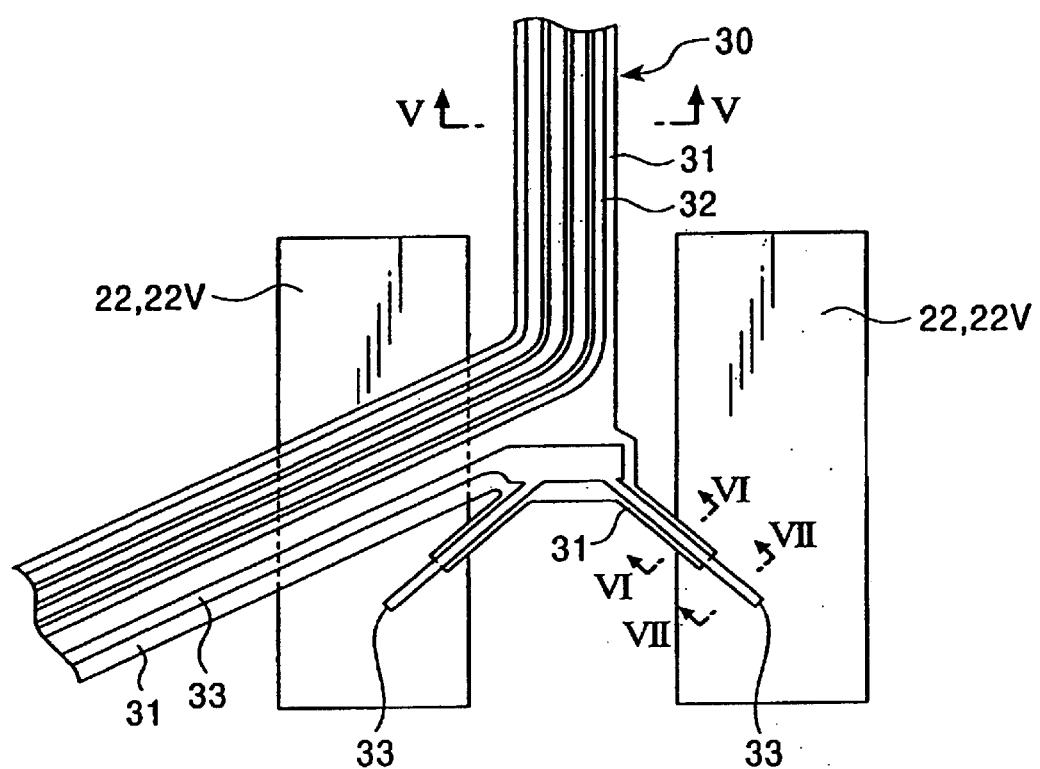
FIG. 4 is an enlarged plan view of a portion of the magnetic head actuator according to a first embodiment of the present invention.
Figure 5:
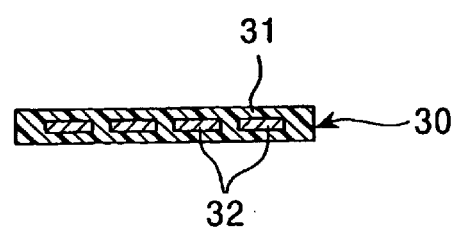
FIG. 5 is a cross-sectional view taken along the line V—V shown in FIG. 4.
Figure 6:
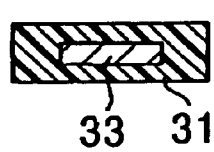
FIG. 6 is a cross-sectional view taken along the lines VI—VI shown in FIG. 4.
Figure 7:
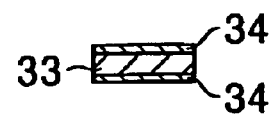
FIG. 7 is a cross-sectional view taken along the lines VII—VII shown in FIG. 4.
Figure 8:
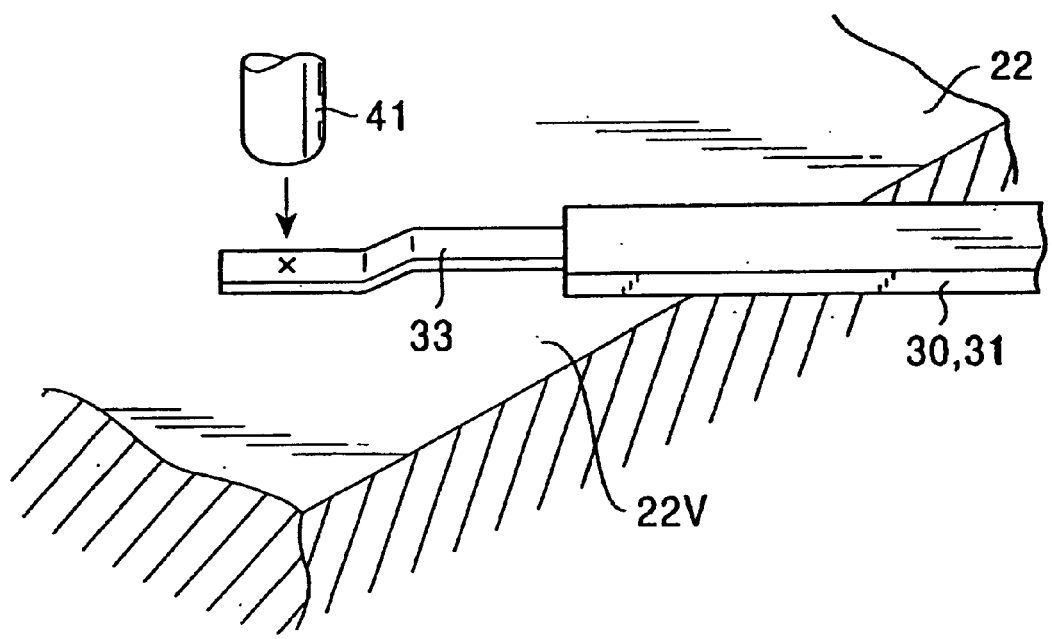
FIG. 8 is a schematic view illustrating the bonding structure of a feeding line of an FPC board and a voltage-impressing electrode of a piezoelectric element according to the first embodiment.
Figure 9:
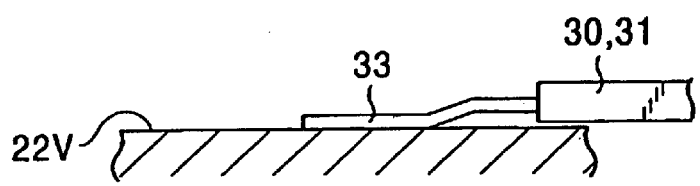
FIG. 9 is a partial cross-sectional view of the bonding state in FIG. 8.

As illustrated in FIG. 2, commonly used for the magnetic head 21 and the piezoelectric elements 22, has trace lines 32 leading to the magnetic head 21 and a pair of feeding lines 33 leading to the corresponding piezoelectric elements 22. These lines 32 and 33 are both embedded in a resin base 31 (shown, for example, in FIGS. 4 and 5), which is typically formed of a polyamide resin. The trace lines 32 are connected to the magnetic head 21 at one end of the trace lines 32 and to a record-playback circuit 15 at the other end. The feeding lines 33 are connected to the corresponding voltage-impressing electrodes 22V of the piezoelectric elements 22 at one end of the feeding lines 33. The feeding lines 33 are also connected to a control circuit 16 at the other end thereof. Referring back to FIG. 1, the control circuit 16 is connected to the actuator 14. The actuator 14 and the piezoelectric elements 22 are controlled in accordance with control signals transmitted from the control circuit 16. The magnetic head 21 sends tracking signals received from the hard disk 12 to the control circuit 16, while exchanging record-playback information signals with the record-playback circuit 15. With this configuration, the control circuit 16 allows the swing arm 20, i.e., the magnetic head 21 controls the actuator 14 and the piezoelectric elements 22 so as to move in a proper track position.

In the above configuration, the embodiment has structural features for connecting the piezoelectric elements 22 of the magnetic head actuator and the corresponding feeding lines 33. As described previously, the piezoelectric element 22 and the feeding line 33 have been bonded by known Au wire bonding, thereby causing problems of high cost and wire breakage.

In the following description with respect to bonding between the feeding lines 33 and the corresponding voltage-impressing electrodes 22V, a combination of the feeding line 33 and the corresponding voltage-impressing electrode 22V will be referred to, since the other combination is bonded in the same manner.

FIGS. 4 to 9 illustrate a first embodiment of the present invention. The FPC board 30, having the resin base 31 and the feeding lines 33, is arranged to extend onto the voltage-impressing electrodes 22V of the piezoelectric elements 22. The feeding lines 33 are partially exposed by removing the resin base 31 from the portion of feeding lines 33 that extend onto the voltage-impressing electrodes 22V. The feeding lines 33 are typically composed of copper (Cu) and have gold plating layers 34 on the exposed portions of the front and back surfaces of the feeding lines 33. The resin base 31 and the feeding lines 33 both extend onto the voltage-impressing electrodes 22V and are held on the side of the FPC board 30 until the feeding line 33 is connected to the piezoelectric element 22. The feeding lines 33 have a thickness of, for example, about 10 to about 20 µm.

In this embodiment, the feeding line 33 of the FPC board 30 abuts against the voltage-impressing electrode 22V, and an ultrasonic probe 41 is brought into contact with the portion of the feeding line 33 lying on the voltage-impressing electrode 22V. Then, the feeding line 33 and the voltage-impressing electrode 22V are bonded by ultrasonic bonding. During the ultrasonic bonding process, the gold in the gold plating layers 34 on the front and back surfaces of the feeding line 33 is dispersed into the surface layer of the voltage-impressing electrode 22V, thereby bonding the feeding line 33 and the electrode 22V.

Figure 10:
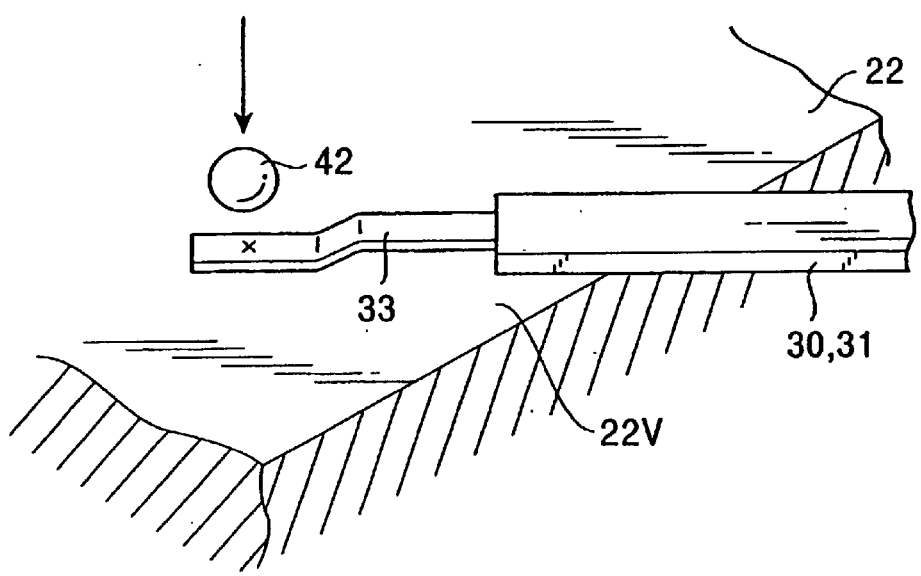
FIG. 10 is a schematic view illustrating the bonding structure of a feeding line of the FPC board and the voltage-impressing electrode of the piezoelectric element according to a second embodiment of the present invention.
Figure 11:
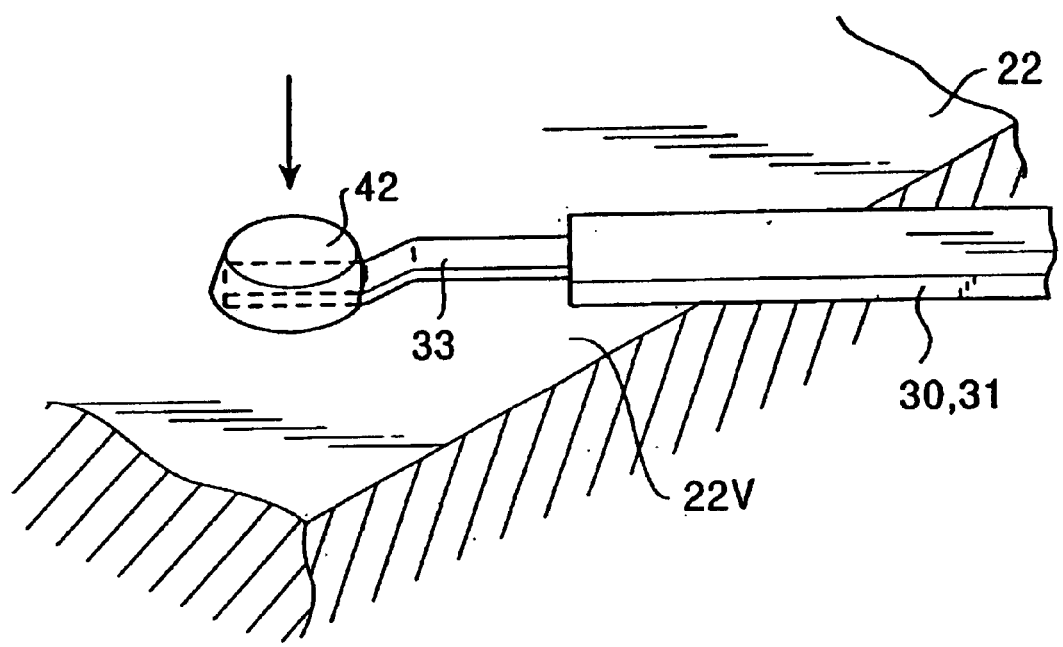
FIG. 11 is a schematic view illustrating a bonding state after the bonding in FIG. 10 is completed.
Figure 12:
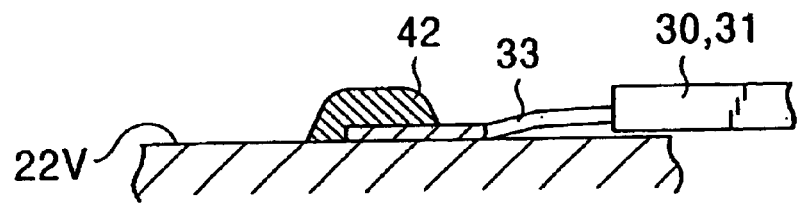
FIG. 12 is a partial cross-sectional view illustrating the bonding state shown in FIG. 11.
Figure 13:
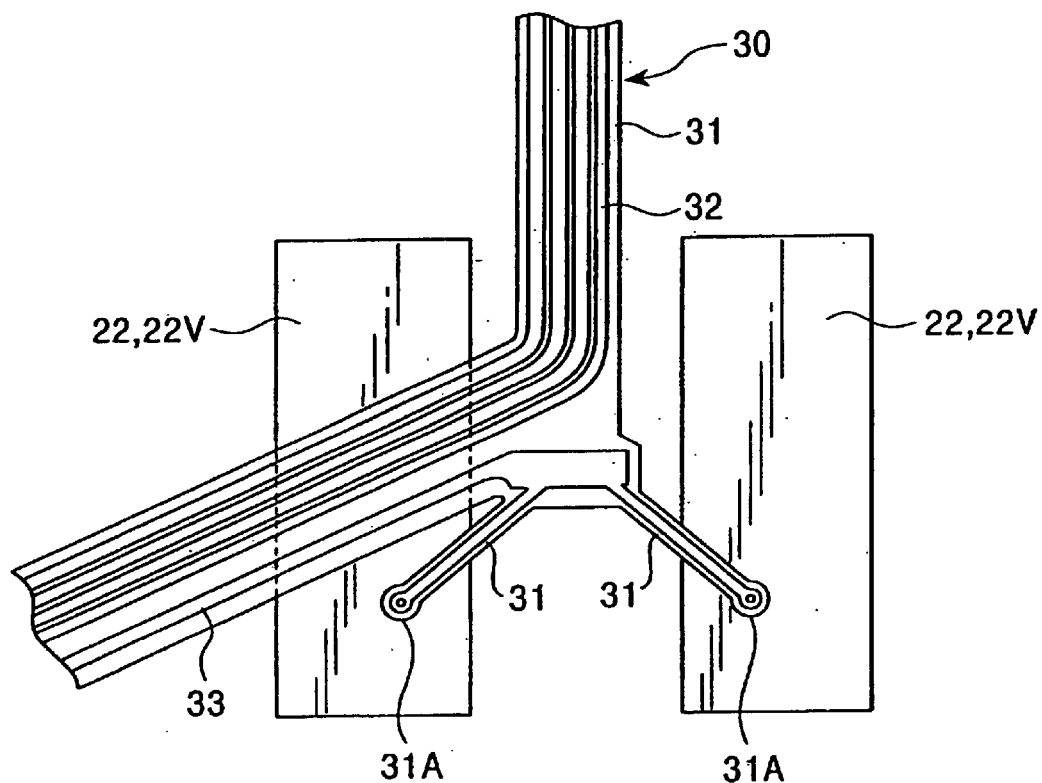
FIG. 13 is an enlarged plan view of a portion of the magnetic head actuator according to a third embodiment of the present invention.
Figure 14:
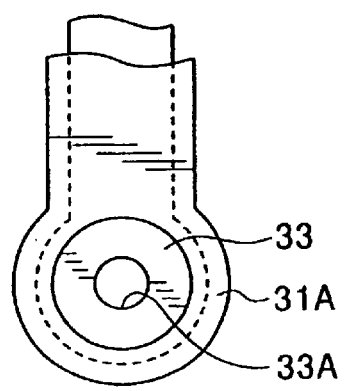
FIG. 14 is an enlarged plan view of a feed line portion in accordance with the third embodiment where feeding line is exposed by removing a resin base of the FPC board.
Figure 15:
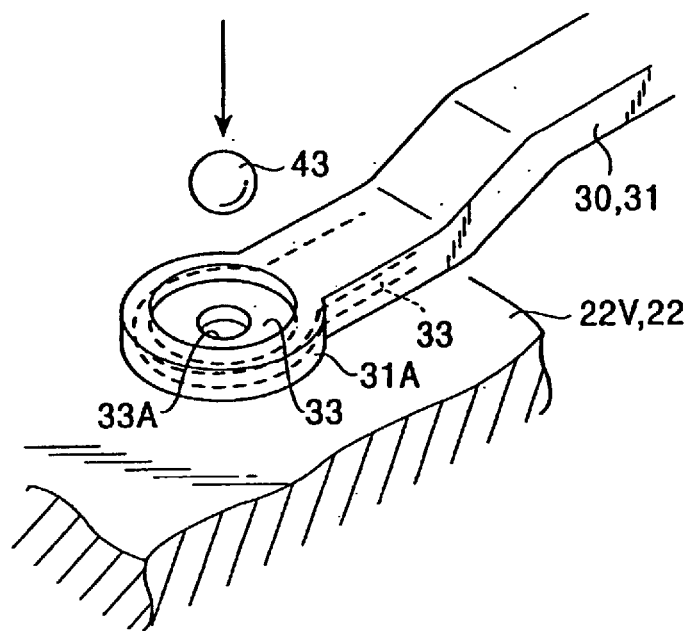
FIG. 15 is a schematic view illustrating the bonding structure of the feeding line of the FPC board and the voltage-impressing electrode of the piezoelectric element according to a third embodiment of the present invention.
Figure 16:
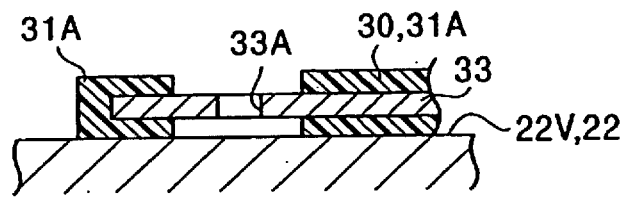
FIG. 16 is a cross-sectional view illustrating a bonding structure in accordance with the third embodiment before the bonding in FIG. 15 is performed.
Figure 17:
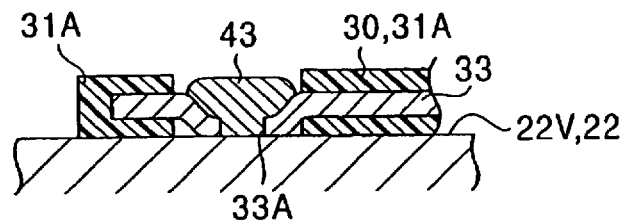
FIG. 17 is a cross-sectional view illustrating the bonding structure in accordance with the third embodiment after the bonding in FIG. 15 is completed.

FIGS. 10 to 12 illustrate a second embodiment of the invention, in which the feeding line 33 and the voltage-impressing electrode 22V are bonded with a gold ball 42 by well-known Au ball bonding instead of the ultrasonic bonding. The bonding according to the second embodiment can cause less damage to the feeding lines 33 than bonding, thereby potentially providing more reliable connections.

FIGS. 13 to 17 illustrate a third embodiment of the present invention. The feeding line 33, embedded in the resin base 31 of the FPC board 30, is partially exposed at the upper and lower portions of the feeding line 33 that extend onto the voltage-impressing electrode 22V of the piezoelectric element 22. In this embodiment, the resin base 31 at the end of the feeding line 33 is partially removed in a round form so as to leave a remaining ring 31A on the front and back surfaces of the feeding line 33. The resin removed portion is thereby surrounded by the remaining ring 31A. The resin base 31, typically formed of a polyamide resin, covers and reinforces the feeding line 33 other than the inside of the remaining ring 31A. In this configuration, the feeding line 33 is rarely broken without exerting an external force. The feeding line 33 has a through-hole 33A inside the remaining ring 31A. A remaining portion is not necessarily circular; however, it is advantageous from the viewpoint of strength that the remaining portion is formed in a closed loop. The inner diameter of the remaining ring 31A is, for example, about 0.2 to about 0.7 mm.

In this embodiment, the remaining ring 31A is placed on the voltage-impressing electrode 22V and a gold ball 43 is inserted through the through-hole 33A toward the voltage-impressing electrode 22V. Then, the feeding line 33 of the FPC board 30 and the voltage-impressing electrode 22V are bonded by Au ball bonding. The bonding according to this embodiment, the remaining ring 31A of the resin base 31, reinforces the feeding line 33. Accordingly, there are few possibilities for wire breakage and the manufacturability and reliability of the magnetic head actuator are also improved.

Figure 18:
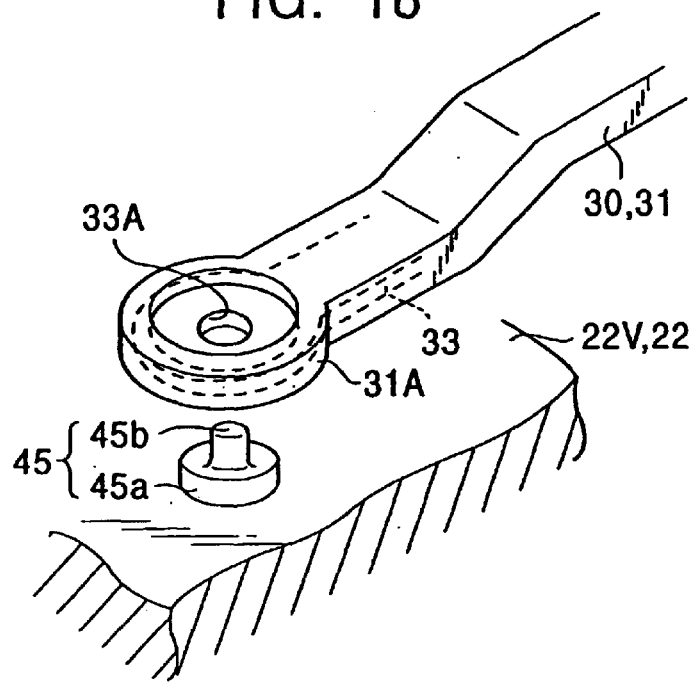
FIG. 18 is a schematic view illustrating the bonding structure of the feeding line of the FPC board and the voltage-impressing electrode of the piezoelectric element according to a fourth embodiment of the present invention.
Figure 19:
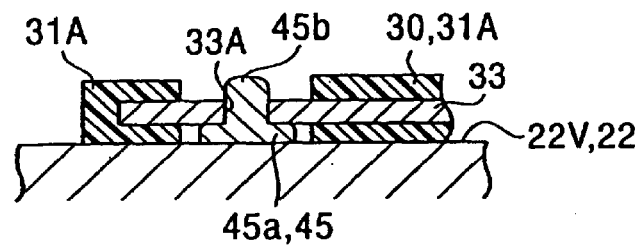
FIG. 19 is a cross-sectional view illustrating the bonding structure according to the fourth embodiment in which the bonding in FIG. 18 is in progress.
Figure 20:
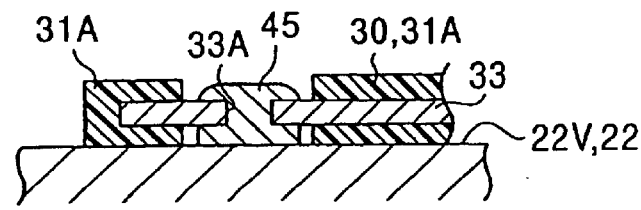
FIG. 20 is a cross-sectional view illustrating the bonding structure according to the fourth embodiment after the bonding in FIG. 18 is completed.

FIGS. 18 and 19 illustrate a fourth embodiment of the invention, bonding the feeding line 33 and the voltage-impressing electrode 22V is completed by stud bumping instead of Au ball bonding. The voltage-impressing electrode 22V has a stud bump 45 thereon that is accreted in advance of bonding by discharging a gold ball. The stud bump 45 consists of a large diameter portion 45a firmly bonded to the voltage-impressing electrode 22V, and a small diameter portion 45b formed on the large diameter portion 45a. The shape of the stud bump 45 is determined depending on the shape of a capillary for a gold ball.

The feeding line 33 of the FPC board 30 and the voltage-impressing electrode 22V are bonded as follows. After the small diameter portion 45b of the stud bump 45 is inserted into the through-hole 33A of the feeding line 33, an ultrasonic probe is brought into contact on the small diameter portion 45b so as to crush the small diameter portion 45b. In accordance with this embodiment of the invention, a sufficient area is provided for bonding the feeding line 33 and the voltage-impressing electrode 22V, thereby enhancing the reliability of the connection.

As illustrated in FIGS. 4 to 9, although the gold plating layer 34 must be formed on the front and back surfaces of the feeding line 33 for the ultrasonic bonding process used to fabricate a magnetic head actuator according to the first embodiment, the gold plating layer 34 is optional in the bonding process used to fabricate a magnetic head according to the other embodiments. The gold plating layer 34, however, has an advantage in enhancing the electrical and mechanical bonding strength.

Technologies for forming the trace lines 32 and the feeding lines 33 with an arbitrary pattern in the resin base 31 of the FPC board 30 have already been established. Further, the resin base 31, once formed, can also be easily patterned with an arbitrary pattern by a physicochemical method, such as etching. Specifically, in a reactive ion etching (RIE) device, for example, the resin base reacts with gas ions to partially remove the resin base and thus form a pattern.

What is claimed is:

1. A magnetic head actuator having a finely movable tracking device comprising:

a swing arm extending in a first plane and having a magnetic head at a free end and reciprocally movable around a coarse rotation axis at a base of the swing arm, the swing arm having an opening therein, wherein the opening is defined by edges extending in a second plane substantially perpendicular to the first plane;

a piezoelectric element having opposed edges and suspended within the opening of the swing arm, such that the opposed edges are parallel with the edges of the opening;

a non-shrinkable adhesive contacting the opposed edges of the piezoelectric element and corresponding edges of the opening, the piezoelectric element having a voltage-impressing electrode for allowing a fine arcuate movement of the free end around the coarse rotation axis in response to an applied voltage;

an FPC board having a resin base and a feeding line embedded in the resin base for feeding power to the voltage-impressing electrode, wherein a portion of the resin base is removed to expose a portion of the feeding line that extends onto the electrode; and a direct physical connection between the feeding line and the voltage impressing electrode at the exposed portion of the feeding line.

2. The magnetic head actuator according to claim 1, wherein the direct physical connection comprises an ultrasonic bond, wherein a portion of the material of the feeding line resides in the voltage impressing electrode.

3. The magnetic head actuator according to claim 1, wherein the direct physical connection comprises an Au ball bond.

4. The magnetic head actuator according to claim 1, wherein the direct physical connection comprises a through-hole in the exposed portion of feeding line that is electrically connected to the voltage-impressing electrode by a gold ball positioned in the through-hole.

5. The magnetic head actuator according to claim 1, wherein the direct physical connection comprises a stud bump made of conductive material residing on the piezoelectric element, and wherein the exposed portion of the feeding line is electrically connected to the voltage-impressing electrode by a stud bump positioned in a through-hole located in the exposed portion of the feeding line.

6. The magnetic head actuator according to claim 1 further comprising a pair of piezoelectric elements having polarities opposite to each other.

7. The magnetic head actuator according to claim 1, further comprising a trace line leading to the magnetic head and extending, together with the feeding line, in the FPC board.

8. A magnetic head actuator having a finely movable tracking device comprising:
   a swing arm extending in a first plane and having a magnetic head at a free end and reciprocally movable around a coarse rotation axis at a base of a base of the swing arm, the swing arm having an opening therein, wherein the opening is defined by edges extending in a second plane substantially perpendicular to the first plane;
   a piezoelectric element having opposed edges and suspended within the opening of the swing arm such that the opposed edges are parallel with the edges of the opening;
   a non-shrinkable adhesive contacting the opposed edges of the piezoelectric element and corresponding edges of the opening, the piezoelectric element having a voltage-impressing electrode for allowing a fine arcuate movement of the free end around the coarse rotation axis when a voltage is applied; and
   an FPC board having a resin base and a feeding line embedded in the resin base for feeding power to the voltage-impressing electrode,
   wherein the feeding line resides completely within the FPC board except for an exposed portion extending onto the voltage impressing electrode, and wherein the exposed portion is bonded to the piezoelectric element by a direct physical connection between the voltage-impressing electrode and the exposed portion.

9. The magnetic head actuator according to claim 8, wherein the direct physical connection comprises an ultrasonic bond, wherein a portion of the material of the feeding line resides in the voltage impressing electrode.

10. The magnetic head actuator according to claim 8, wherein the direct physical connection comprises an Au ball bond.

11. The magnetic head actuator according to claim 8, wherein the direct physical connection comprises a through-hole in the exposed portion of the feeding line that is electrically connected to the voltage-impressing electrode by a gold ball positioned in the through-hole.

12. The magnetic head actuator according to claim 8, wherein the direct physical connection comprises a stud bump made of a conductive material residing on the piezoelectric element, and wherein the exposed portion of the feeding line is electrically connected to the voltage-impressing electrode by a stud bump positioned in a through-hole located in the exposed portion of the feeding line.

13. The magnetic head actuator according to claim 8 further comprising a pair of piezoelectric elements having polarities opposite to each other.

14. The magnetic head actuator according to claim 8, further comprising a trace line leading to the magnetic head and extending, together with the feeding line, in the FPC board.

15. A magnetic head actuator having a finely movable tracking device comprising:
   a swing arm extending in a first plane and having a magnetic head at a free end and reciprocally movable around a coarse rotation axis at a base end of the swing arm;
   a flexible section connecting the free end with the base end, the flexible section having outwardly extending bends and first and second openings therein,
   wherein the first and second openings are defined by edges extending in a second plane substantially perpendicular to the first plane;
   first and second piezoelectric elements, each having opposed edges and suspended within the first and second openings, respectively, such that the opposed edges of each piezoelectric element are parallel with the edges of the opening;
   a non-shrinkable adhesive contacting the opposed edges of the first and second piezoelectric elements and corresponding edges of the first and second openings, each of the first and second piezoelectric elements having a voltage-impressing electrode on a first face for allowing a fine arcuate movement of the free end around the coarse rotation axis in response to an applied voltage, and a ground electrode on an opposite face;
   an FPC board having a resin base and a feeding line embedded in the resin base for feeding power to the voltage-impressing electrode,
   wherein a portion of the resin base is removed to expose a portion of the feeding line that extends onto the electrode; and
a direct physical connection between the feeding line and the voltage impressing electrode at the exposed portion of the feeding line.

16. A magnetic head actuator having a finely movable tracking device comprising:
   a swing arm extending in a first plane and having a magnetic head at a free end and reciprocally movable around a coarse rotation axis at a base end of the swing arm;
   a flexible section connecting the free end with the base end, the flexible section having outwardly extending bends and first and second openings therein,
   wherein the first and second openings are defined by edges extending in a second plane substantially perpendicular to the first plane;
   first and second piezoelectric elements, each having opposed edges and suspended within the first and second openings, respectively, such that the opposed edges of each piezoelectric element are parallel with the edges of the opening;
   a non-shrinkable adhesive contacting the opposed edges of the first and second piezoelectric elements and corresponding edges of the first and second openings, each of the first and second piezoelectric elements having a voltage-impressing electrode on a first face for allowing a fine arcuate movement of the free end around the coarse rotation axis in response to an applied voltage, and a ground electrode on an opposite face;
   an FPC board having a resin base and a feeding line embedded in the resin base for feeding power to the voltage-impressing electrode,
   wherein a portion of the resin base is removed to expose a portion of the feeding line that extends onto the electrode; and a direct physical connection between the feeding line and the voltage impressing electrode at the exposed portion of the feeding line, wherein the base end, flexible section, and free end are configured such that about a one micrometer contraction of the first or second piezoelectric elements creates about a ten micrometer arcuate movement about the coarse axis.

17. The magnetic head actuator according to claim 16, wherein the FPC board is mounted to a surface of the swing arm and spans at least one of the first and second openings in the swing arm, and wherein the piezoelectric element is disposed in the opening, such that the piezoelectric element does not protrude above the surface of the swing arm.

18. A magnetic head actuator having a finely movable tracking device comprising:
  a swing arm extending in a first plane and having a magnetic head at a free end and reciprocally movable around a coarse rotation axis at a base of the swing arm, the swing arm having an opening therein,
  wherein the opening is defined by edges extending in a second plane substantially perpendicular to the first plane;
  a piezoelectric element having opposed edges and suspended within the opening of the swing arm, such that the opposed edges are parallel with the edges of the opening;
  a non-shrinkable adhesive contacting the opposed edges of the piezoelectric element and corresponding edges of the opening, the piezoelectric element having a voltage-impressing electrode for allowing a fine arcuate movement of the free end around the coarse rotation axis in response to an applied voltage;
  an FPC board having a resin base and a feeding line embedded in the resin base for feeding power to the voltage-impressing electrode,
  wherein a portion of the resin base is removed to expose a portion of the feeding line that extends onto the electrode; and
  a direct physical connection between the feeding line and the voltage impressing electrode at the exposed portion of the feeding line,
wherein the FPC board is mounted to a surface of the swing arm and spans the opening in the swing arm, and wherein the piezoelectric element is disposed in the opening, such that the piezoelectric element does not protrude above the surface of the swing arm.

19. A magnetic head actuator having a finely movable tracking device comprising:
  a swing arm extending in a first plane and having a magnetic head at a free end and reciprocally movable around a coarse rotation axis at a base of a base of the swing arm, the swing arm having an opening therein,
  wherein the opening is defined by edges extending in a second plane substantially perpendicular to the first plane;
  a piezoelectric element having opposed edges and suspended within the opening of the swing arm such that the opposed edges are parallel with the edges of the opening;
  a non-shrinkable adhesive contacting the opposed edges of the piezoelectric element and corresponding edges of the opening, the piezoelectric element having a voltage-impressing electrode for allowing a fine arcuate movement of the free end around the coarse rotation axis when a voltage is applied; and
  an FPC board having a resin base and a feeding line embedded in the resin base for feeding power to the voltage-impressing electrode,
  wherein the feeding line resides completely within the FPC board except for an exposed portion extending onto the voltage impressing electrode,
  wherein the exposed portion is bonded to the piezoelectric element by a direct physical connection between the voltage-impressing electrode and the exposed portion, and
wherein the FPC board is mounted to a surface of the swing arm and spans the opening in the swing arm, and wherein the piezoelectric element is disposed in the opening, such that the piezoelectric element does not protrude above the surface of the swing arm.

20. A magnetic head actuator having a finely movable tracking device comprising:
  a swing arm having a magnetic head at a free end and reciprocally movable around a coarse rotation axis at a base of the swing arm, the swing arm having an opening therein,
  a piezoelectric element suspended within the opening of the swing arm, the piezoelectric element having a voltage-impressing electrode for allowing a fine arcuate movement of the free end around the coarse rotation axis in response to an applied voltage;
  an FPC board mounted to a surface of the swing arm and spanning the opening, the FPC board having a resin base and a feeding line embedded in the resin base for feeding power to the voltage-impressing electrode,
  wherein a portion of the resin base is removed to expose a portion of the feeding line that extends onto the electrode, and
  wherein the piezoelectric element is disposed within the opening, such that the piezoelectric element does not protrude above the surface of the swing arm; and
  a direct physical connection between the feeding line and the voltage impressing electrode at the exposed portion of the feeding line.

* * * * *